United States Patent [19]
Holzman
[11] Patent Number: 4,965,927
[45] Date of Patent: Oct. 30, 1990

[54] APPARATUS FOR APPLYING SURFACE-MOUNTED ELECTRONIC COMPONENTS TO PRINTED CIRCUIT BOARDS

[76] Inventor: Eli Holzman, 2787 Parkview Dr., Thousand Oaks, Calif. 91362

[21] Appl. No.: 410,726
[22] Filed: Sep. 21, 1989
[51] Int. Cl.[5] ........................ B23P 19/00; B29C 33/00
[52] U.S. Cl. ...................................... 29/740; 264/277; 29/739; 29/809; 156/246; 269/903; 414/403; 414/404
[58] Field of Search ............... 29/74 D, 741, 809, 840, 29/760; 156/246, 297, 298, 299; 414/403, 404, 797.4; 264/277; 425/118, 121, 126.1; 269/903; 206/332

[56] References Cited

U.S. PATENT DOCUMENTS 3,120,029 2/1964 Gingrande et al. ............. 264/277 X
3,681,835 8/1972 Evans et al. .................... 269/903 X
4,231,153 11/1980 Browne ................................ 29/739
4,386,464 6/1983 Yanai et al. ........................ 29/739 X
4,451,324 5/1984 Ichikawa et al. ................. 29/740 X
4,452,557 6/1984 Bouwknegt et al. ............. 29/740 X
4,868,979 9/1989 Fukushima et al. .............. 29/740 X

FOREIGN PATENT DOCUMENTS 56-165616 12/1981 Japan ............................... 414/797.4

*Primary Examiner*—Carl E. Hall
*Assistant Examiner*—Carl J. Arbes
*Attorney, Agent, or Firm*—Robert L. Finkel

[57] ABSTRACT

Apparatus for applying surface-mounted electronic components to printed circuit boards incorporates a fixture for populating an entire board in a single operation. The fixture comprises an array of upstanding open-ended tubular guides rigidly supported in a block of elastomeric material. Component-dispensing magazines are inserted into the guides. Novel ejectors in each magazine dispense components from all of the magazines simultaneously.

35 Claims, 3 Drawing Sheets

FIG. 1
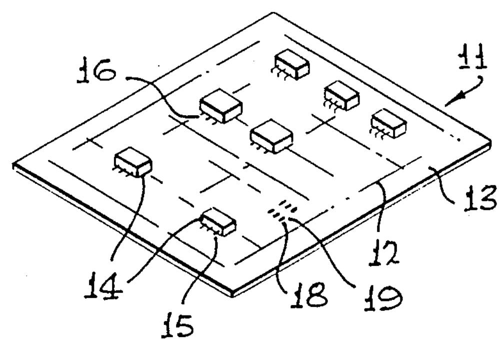
FIG. 2
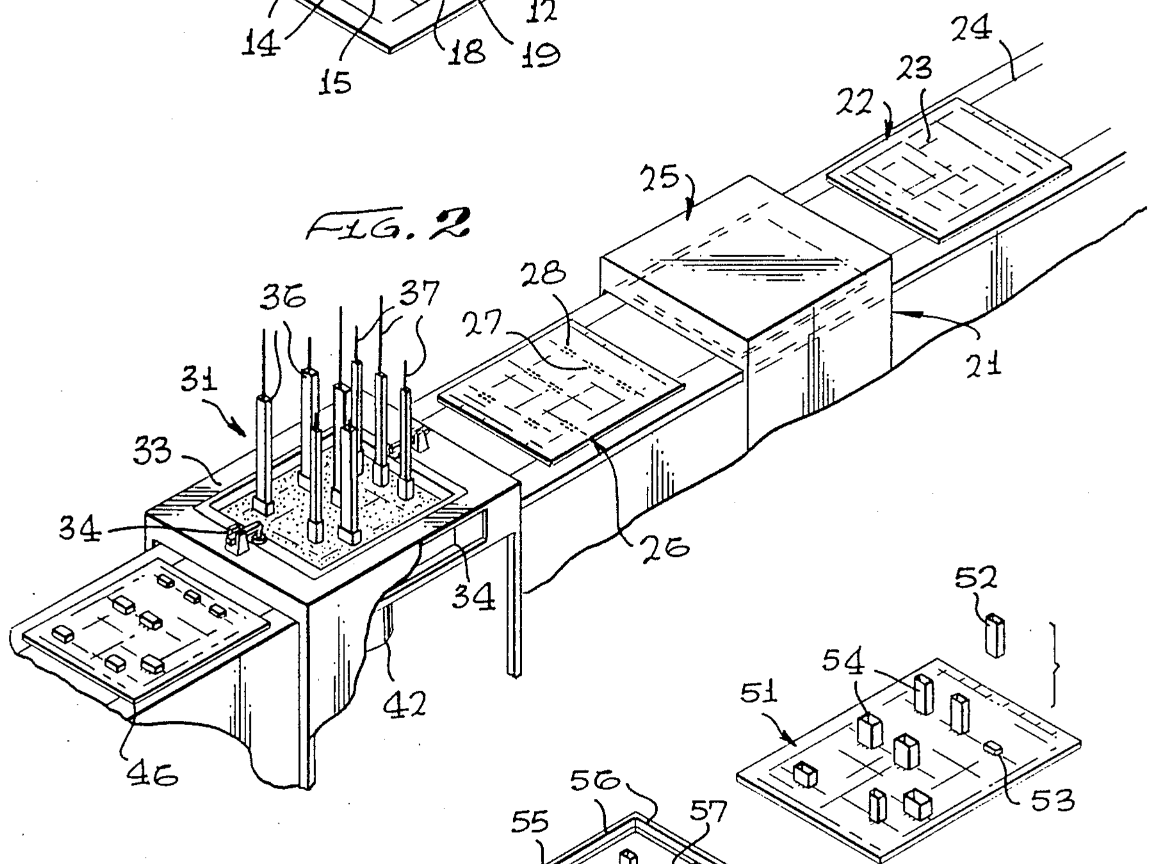
FIG. 3a
56
55
57
58
FIG. 3b
61
54
62
52
63
FIG. 3c 77
78
74
85
81
83
71
86
82
36
68
65
73
72
54
34
33
63
66
27
28
26
38
42
41
62

APPARATUS FOR APPLYING SURFACE-MOUNTED ELECTRONIC COMPONENTS TO PRINTED CIRCUIT BOARDS

BACKGROUND OF THE INVENTION

1. Field of the Invention

This invention relates to methods and means for applying surface-mounted solid-state electronic components to printed circuit boards during the board assembly process. More particularly it is concerned with methods and means employing a fixed array of component-dispensing magazines for populating an entire board in a single operation.

2. Prior Art

Since the advent of the semiconductor, the ongoing competetive drive in the electronics industry has been to decrease the size, increase the functional capability and performance, and reduce the cost of solid-state devices and integrated circuits incorporating them.

As a result, advances in the field of component technology now provide virtually unlimited flexibility in integrated circuit design. Similarly, improvements in component packaging, and particularly in the packaging of both passive and active devices for surface-mounting, allow existing circuits to be made more compact and more powerful circuits to be compressed into a given space on the printed circuit board.

Conventionally, during the assembly of a surface-mounted printed circuit board, the components are applied to, and temporarily held in place by a layer of solder paste previously silk-screened on to the metallized mounting pads on the surface of the board. When that surface has been populated, the adhesive is cured to ensure the components will not be released on heating, and the board is heated to reflow the solder. When cooled, the solder connects the components to the electrical circuit and permanently secures them to the board.

To take advantage of the previously mentioned developments, methods and means must be provided for populating the printed circuit board with the resistors, capacitors, inductors, diodes, transistors, small outline integrated circuits ("SOICs"), plastic leaded chip carriers (PLCCs), leadless ceramic chip carriers ("LCCCs"), and other components that make the circuit work. For most applications, hand-assembly is not practical. Automated assembling means are clearly called for.

A great deal of effort has gone into the design and construction of such machines. A number of different approaches have been taken. One of these employs an in-line conveyor, or a numerically controlled cartesian drive system to positioned the board being assembled under a succession of component-dispensing heads which mount each component to the board in its predetermined location. Machines of this type are particularly suitable for high-throughput in a high-volume production line environment, but they are generally limited in the number and variety of components they can handle at one time and relatively difficult to modify for changes in board design.

In another type of assembler, computer-operated robotic devices or relatively fixed dispensing heads select the components from a feeder or feeding station and place them in their intended locations on the board. In the robotic machines the pickup moves in X and Y directions and may rotate as well. In the fixed-head autoassemblers, a removeable table positions the board under the dispenser. These highly sophisticated "pick-and-place" devices are adaptable to dispense practically any surface-mounted component rapidly and with great accuracy. Many of them are provided with computerized vision or other position-sensing means to enhance the accuracy of component placement. Intended primarily for high-precision work, these machines are generally limited to medium or low throughput situations. They are extremely sensitive and require highly skilled personnel for their set up, maintenance and operation. Particularly they are very expensive.

A third type of placement machine incorporates a cartesian table and multiple dispensing heads arranged in succession. The heads are generally mounted on a rotating turret, which allows their jaws, fingers, or suction tubes to pick up a component at a feeding station and place it on the board. These pick-and-place machines are roughly comparable in capability to the previously mentioned robotic and fixed-head assemblers and suffer from the same limitations and deficiencies. These machines are generally somewhat less flexible than the robotic or fixed-head assemblers, and like them, most often have only low- or medium-throughput compacity.

Another class of autoassembler provides for the population of an entire board, or part of a board, in a single operation. Some assemblers of this type utilize a fixed array of pipettes or component-grasping means to place a number of electronic parts in their respective locations at one time. Others transfer the components by means of a template on which each component occupies the position assigned to it on a printed circuit board. Another assembler in this category is exemplified by U.S. Pat. Nos. 4,127,432, 4,375,126, and 4,462,737. These devices apply the electronic modules directly to the surface of the board by means of an array of component-dispensing magazines. This is the approach taken in the present invention, with several novel improvements.

As seen in the previously mentioned patents, conventionally the component-dispensing magazines are vertically supported in a rigid lattice-shaped matrix. The components are positioned in the respective magazines and ejected from the magazines by means of one or more sets of rods or pistons which are thrust axially into the magazines. These devices suffer from several serious limitations. For one, the physical constraints imposed by the structure of the matrix itself limits the user's ability to positioned the electronic components on the surface of the printed circuit board. In practice, this limitation mandates that the circuit be designed to conform to the geometry of the lattice work. This requirement is unacceptable for all but the most rudimentary circuit designs.

Similarly, the structure of the matrix narrowly limits the size, shape and polar orientation of the components it is capable of assembling.

Additionally, the mass of the lattice structure limits the density with which the components can be assembled on the board's surface. To reduce the mass of the lattice by employing thinner structural members will result in a weakening of the structure supporting the magazines and the integrity of the assembly apparatus.

Still further, these prior art devices must provide a push-rod assembly for each of the through-holes in the matrix which could be occupied by a magazine, even though in operation the majority of those positions would not in fact be occupied. The use of push-rods driven by a common drive mechanism necessitates the provision of means for compensating for differences in thickness of the various components. These thickness-compensating means, likewise, must be provided for at each of the through-hole positions, whether components are to be dispensed at those positions or not. The complexity of these mechanisms makes them costly to manufacture and difficult to maintain, and severely limits the ability of these machines to respond to changes in circuit design. A principle object of the present invention is to provide a method and means for applying surface-mounted electronic components to printed circuit boards, which offers all of the advantages, and avoids the defficiencies inherent in devices of the type described.

More particularly, an object of this invention is the provision of a novel fixture for positioning a plurality of surface-mounted electronic component dispensing magazines for use in a circuit board assembling apparatus.

Another object is the provision of a surface-mounting assembling machine incorporating the aforementioned fixture.

Still another object is the provision of a fixture and assembly machine of the aforementioned type, which are capable of positioning a large number of surface-mounted components in an single operational step with great accuracy and assured repeatability.

A further object is the provision of a surface-mounting apparatus of the type mentioned, having a minimum number of moving parts requiring machine-disabling maintenance.

A further object is the provision of an assembly machine which can be modified rapidly and easily to conform to changes in printed circuit design, and which does not require highly-skilled personnel for set up, operation or modification.

A still further object is the provision of an apparatus of the type mentioned, which has the capacity to dispense electronic components of widely varying size and configuration, in any orientation, at any selected position in any desired printed circuit design.

SUMMARY OF THE INVENTION

To achieve the foregoing objects, the subject invention provides an easily-made, inexpensive disposable assembly fixture made by cementing a plurality of upstanding hollow guides to a prototype printed circuit board in the positions to be occupied by the respective electronic components. A dam is formed around the prototype board and the area of the surface of the board surrounding the guides is filled with an epoxy or similar elastomeric material. When the mass has hardened into a rigid block, the board is removed, exposing the open ends of the rigidly supported guides.

The surface-mounted components to be applied to the production boards are contained in a plurality of magazines adapted for insertion into the guides. The lower ends of the magazines extend upwardly of the lower ends of the guides. An ejector in each magazine ejects a single component at a time from the lower end of the magazine and deposits it on a layer of solder paste or other suitable adhesive applied to the printed circuit board at each position to be occupied by a component.

Following conventional methods, the solder paste or adhesive is cured and IR heating, wave soldering, or other standard techniques used to solder the components permanently in place.

The ejectors in the respective magazines are adapted to operate simultaneously, that is, to discharge a single electronic component in each of the predetermined positions on the printed circuit board in a single operational step. In a preferred embodiment of the apparatus, this is achieved by a unique ejector design, wherein a pair of springs compressed between the top of the magazine and a plate connecting a pair of shim strips attached to the fixture guide associated with the magazine cooperate with a pair of ratchet blocks and ratchets to "walk" a drive shaft downwardly against the components stacked in the magazine when the magazine is forced upwardly into its guide. Raising the platen on which the production printed circuit board is positioned in the assembling machine brings the upper surface of the board into contact with the lower ends of all of the magazines, and forces them upwardly to discharge their respective components simultaneously. Resilient retaining means at the lower end of each magazine retain the stack of components and ensure that only one component is ejected from each magazine in each operational step.

While the aforementioned ejection mechanism is preferred, alternative mechanisms, such as a hydraulic or pneumatic fluid-operated ram or electromagnetically operated ram may be used in its place. If these were used in place of the ratchet-operated device, means would be provided for actuating all of the devices simultaneously.

With this brief summary in mind, other objects and features of the invention, and its operation will become apparent to the reader from the following detailed description of several of its preferred embodiments as illustrated in the accompanying set of drawings.

DESCRIPTION OF THE DRAWINGS

In the drawings:

FIG. 1 is a top perspective view of a fanciful printed circuit board with its assemblage of surface-mounted components;

FIG. 2 is a fragmentary top perspective view of a fanciful surface-mounted printed circuit board assembly line in accordance with the subject invention;

FIGS. 3*a*–3*c* are sequential top perspective views of the three principal steps in the formation of a magazine-supporting fixture in accordance with the subject invention;

DETAILED DESCRIPTION

Figures 4, 5, 6:
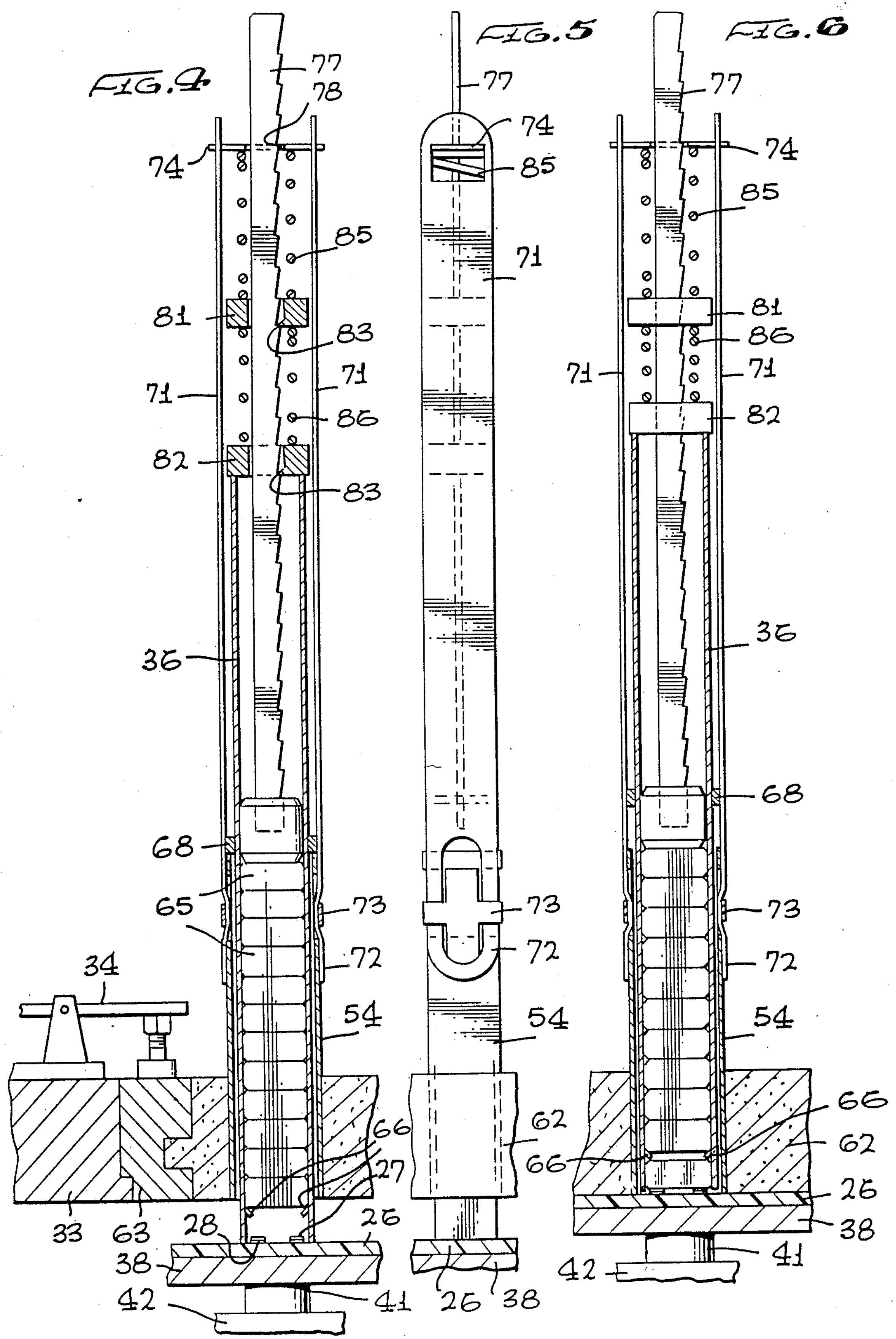
FIG. 4 is a fragmentary front sectional view taken through a magazine guide and its associated magazine in accordance with the subject invention, showing the ejector and powering means immediately before the ejection of a component.
FIG. 5 is fragmentary side view of the magazine guide and magazine of FIG. 4.
FIG. 6 is a fragmentary front sectional view of the guide and magazine of FIG. 4, showing the ejector and powering means immediately after the ejection of a component.

Referring to FIG. 1, in a typical surface-mounted printed circuit board 11 the "wiring" portion of the electrical circuit is printed as a conductive trace 12 on the surface of the conveyor 24 in vertical alinement with fixture 31 is mounted to a piston 41 (not visible). Drive means, such as solenoid 42 mounted to the base 33, are arranged to thrust piston 41 upwardly, causing platen 38 to lift the circuit board from conveyor 24 and elevate it into contact with the exposed lower ends of magazines 36. Further upward movement of the board under the influence of solenoid 42 triggers all of the ejectors 37 simultaneously and places one component from each magazine 36 on its respective footprint on the board surface. As will be explained shortly, the novel construction of fixture 31 insures close registry between the components' leads and their respective pads.

Once the component leads have made contact with the layer of solder paste on their associated pads, the adhesive strength of the paste is more than adequate to retain the components in position during the remainder of the manufacturing process. At this point, solenoid 42 is deactivated, returning the populated board 46 to conveyor 24 to complete the process.

To prevent the solder paste from softening prematurely during the soldering operation, it is allowed to cure. After curing, the board 46 is subjected to one of the well known reflow procedures to perfect a solder bond between each of the component leads and its pad. Following soldering, all that remains to be done is to give the completed board a thorough cleaning and such inspection as may be called for.

Referring to FIGS. *3a*–*3c*, the preferred method for producing a fixture, such as fixture 31, in accordance with the subject invention begins with the preparation of a prototype 51 of the printed circuit board to be manufactured. The prototype 51 need not include the components, but it is preferable if they are in place.

As seen in FIG. *3a*, an upstanding thin-walled open-ended tubular guide, such as guide 52, 54 is cemented to the board, for example by means of a fast-drying adhesive such as one of the cyano-acrylics, in registry with the footprint of each of the electronic components, such as component 53, with which the production board is to be populated. Each guide 54 is sized and configured to conform closely to a magazine containing a stack of the components associated with its respective footprint. When all of the guides 52,54 are cemented firmly in place, a dam 55 is formed around the periphery of the prototype board 51, as shown in FIG. *3b*. Preferably, the dam 55 is formed from sturdy rigid metal strips 56 having one or more grooves 57 in their inner walls. The space 58 surrounding the guides and contained within the dam 55 is then filled with liquid epoxy, or some other suitable elastomeric material, and the material allowed or caused to harden. Upon its hardening sufficiently to permit handling, the prototype board is carefully separated from the guides 52, 54 and may be discarded, or retained for reuse.

The result of this procedure, as seen in FIG. *3c*, is a fixture 61 comprising a unitary solid block 62 rigidly supporting the upstanding guides 52, 54 and in turn supported by a surrounding rigid metal frame 63.

It should be understood that in this context the word "elastomeric" is intended to connote a material which, when hardened, is rigid and non-deformable (or elastically-deformable). The material may be natural or synthetic. It may be thermo-setting, however, preferably it should set and harden rapidly at room temperature without further processing. For its intended purpose, it must be dimensionally stable throughout the range of temperatures normally expected to be encountered in the circuit board manufacturing process.

FIGS. 4–6 illustrate the construction and operation of the ejectors 37 shown in FIG. 2. Magazine 36, contains a stack of electronic components 65. Components 65 are prevented from falling out of the open lower end of magazine 36 by resilient retaining means 66 at the lower end of the magazine.

Magazine 36 fits slidingly into the open upper end of guide 54. A pair of bosses 68 on the sides of magazine 36 abut the upper end of guide 54. The bosses 68 are positioned so as to allow the lower end of magazine 36 to extend downwardly of the open lower end of guide 54 and the underside of block 62, while preventing magazine 36 from sliding out of guide 54 entirely.

A pair of rigid shim strips 71 are releasably attached at their lower ends to the guide 54 by means of interlocking stirrups 72 and tabs 73. Shim strips 71 are releasably joined at their upper ends by connecting plate 74. A rigid toothed or serrated shaft 77 extends axially downwardly into magazine 36. The upper end of shaft 77 extends upwardly through a slot 78 in plate 74. A pair of ratchet blocks, upper block 81 and lower block 82, are mounted to shaft 77. Ratchets 83 in ratchet blocks 81, 82 engage the teeth or serrations in shaft 77, allowing relative downward motion of shaft 77 with respect to the two ratchet blocks 81, 82, but not relative upward motion. A pair of compression springs. upper spring 85 and lower spring 86, are mounted to shaft 77 and positioned between connecting plate 74 and upper ratchet block 81, and between upper ratchet block 81 and lower ratchet block 82, respectively. Under the combined influence of springs 85 and 86, lower ratchet block 82 is maintained in forceful abutment with the upper end of magazine 36, and shaft 77 is maintained in forceful abutment with the uppermost of the stack of components 65.

As seen in FIG. 4, when platen 38 is elevated by solenoid 42, circuit board 26 is brought into contact with the lower end of magazine 36. Since the fixture 61 was formed using the prototype board 51 as a model, magazine 36 registers quite accurately with the footprint of component 65 on the production board 26.

Referring to FIG. 6, as the force exerted by solenoid 42 drives magazine 36 upwardly, springs 85, 86 are compressed against ratchet blocks 81, 82. When the force exerted by upper spring 85 exceeds the restraining force of restraining means 66 at the lower end of magazine 36, the lowest component 92 in the stack of components 65 is ejected forcefully onto the layer of solder paste 27 on pads 28.

Figure 7:
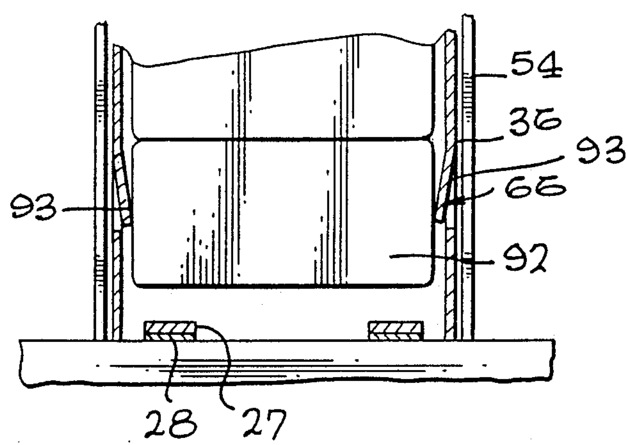
FIG. 7 is an enlarged fragmentary front sectional view taken through the lower ends of the guide and magazine of FIGS. 4–6, showing a preferred form of component-retaining means in accordance with the subject invention.
Figure 8:
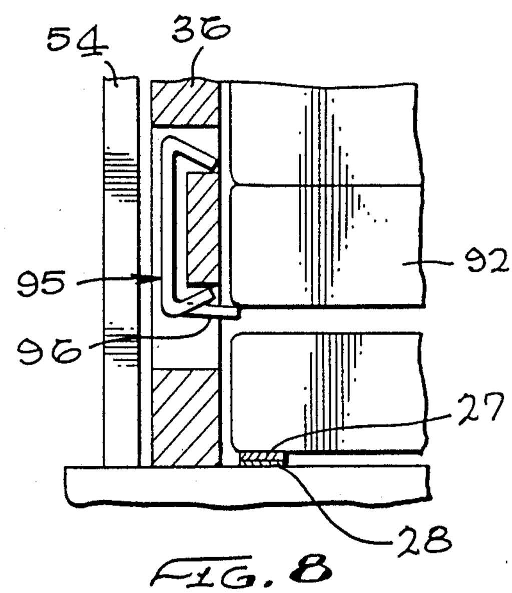
FIG. 8 is an enlarged fragmentary front sectional view through the lower end of another magazine guide and its associated magazine, showing an alternative form of component-retaining means in accordance with the subject invention.
Figure 9:
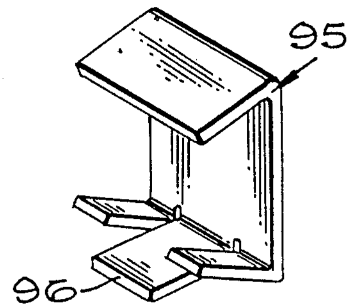
FIG. 9 is an enlarged top perspective view of the component-retaining means of FIG. 8.

FIG. 7 illustrates one embodiment of the component-restraining means 66 of FIGS. 4 and 6. In this instance, portions 93 of the lower ends of opposite walls of magazine 36 are parted from the walls and turned inwardly to serve as restraining means. In the alternative embodiment of FIGS. 8 and 9, a clip 95 having a resilient finger 96 extending into the bore of magazine 36 in the path of component 92 serves the same function.

Figure 10:
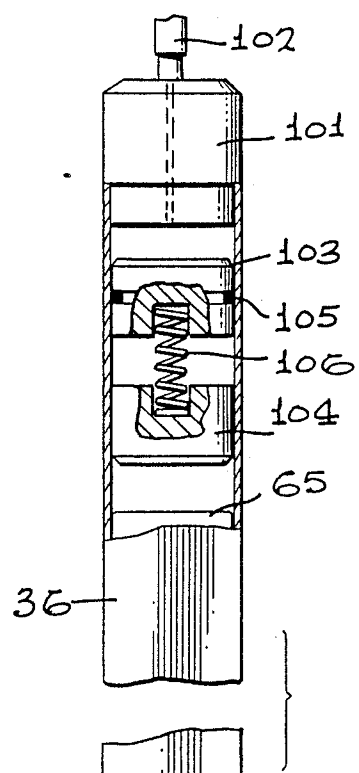
FIG. 10 is a fragmentary partially cut-away side view of another magazine, showing an alternative embodiment of the ejector and powering means of the subject invention.

FIG. 10 illustrates an alternative embodiment of the powering means employed to actuate the ejectors 37 in magazines 36. Here, pneumatic force is used in place of the thrust provided by solenoid 42 in the previously described embodiment.

Each of the magazines 36 is provided with a removable stopper 101 in its upper end. Feed lines 102 connected to stoppers 101 controllably deliver air under pressure from an air supply (not shown).

A pair of pistons 103, 104 reciprocate axially within the bore of magazine 36. O-rings 105 may be provided to seal the chamber above upper piston 103. A compression spring 106 is positioned between upper piston 103 and lower piston 104 to limit the force applied against the components 65 stacked in magazine 36. As with the previously described embodiment, magazine 36 is maintained in position by guide 54. In this embodiment, however, magazine 36 is restrained against movement axially of guide 54 by detent means 107.

In operation, suitable means are used to elevate the printed circuit board being populated into contact with the lower open end of magazine 36. Switching means (not shown) activate the air supply control to direct air under pressure from the air supply through feed lines 102 into the chambers above pistons 103. Upper piston 103 is forced downwardly, compressing spring 106 and applying downwardly directed force against piston 104. When the force exerted by piston 104 downwardly against the uppermost component 65 exceeds the restraining force of resilient retaining means 66 in the lower end of magazine 36, the lowest component 92 in the stack is ejected forceably onto the solder paste 27 on pads 28.

If desired, hydraulic pressure or electromagnetic drive means (neither shown) could be used instead of pneumatic pressure in another alternative embodiment.

Figure 11:
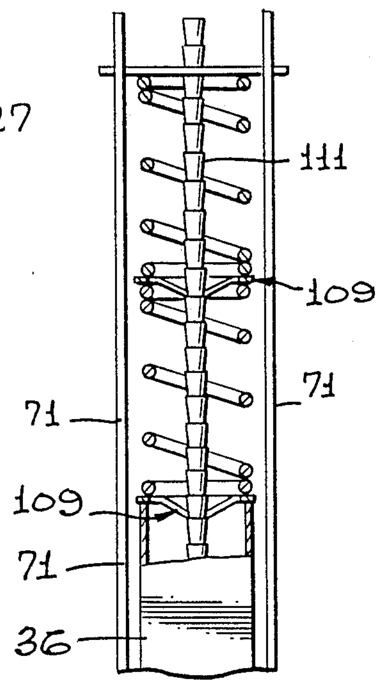
FIG. 11 is a fragmentary partially cut-away side view of still another magazine, showing an alternative embodiment of the ejector and powering means of the subject invention.
Figure 12:
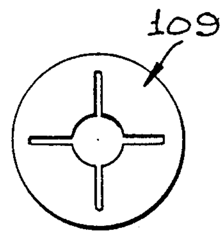
FIG. 12 is an enlarged top plan view of one of the spring washers shown in FIG. 11.

FIG. 11 shows the use of spring washers 109 in lieu of the ratchet blocks 81, 82 illustrated in FIGS. 4 and 6. FIG. 12 offers a plan view of a typical example of a spring washer 109 which would serve the intended purpose. It should be noted that if a radially symmetrical washer 109 of the design shown in FIG. 12 is used, a shaft 111 of generally circular cross section will have to be substituted for the flatened shaft 77 illustrated in the earlier described embodiment. In all other respects, however, the construction and operation of the embodiment of FIGS. 11 and 12 in the previously described embodiments are substantially identical.

While the subject invention has been described here in terms of several preferred embodiments, it is not to be construed as limited to those embodiments. The features depicted are to be regarded as illustrative rather than restrictive. It is intended by this specification to cover any and all variations of the examples shows for purposes of the disclosures, which do not depart from the spirit and scope of the following claims.

I claim:

1. A fixture for positioning a plurality of surface-mounted electronic component dispensing magazines in a printed circuit board assembling apparatus, said fixture comprising:

a plurality of upstanding hollow open-ended guides adapted for receiving said magazines, each guide being positioned in registry with the footprint on a printed circuit board of the component dispensed by its associated magazine, said guides being rigidly supported in a unitary block of elastomeric material.

2. The fixture of claim 1, wherein said block is adapted for releasable mounting to said printed circuit board assembling apparatus.

3. The fixture of claim 2, wherein the periphery of said block is configured to engage mounting means provided on said assembling apparatus.

4. The fixture of claim 2, wherein said block is provided with engaging means for engaging mounting means provided on said assembling apparatus.

5. For use in a printed circuit board assembling apparatus, a device for dispensing a plurality of surface-mounted electronic components at predetermined locations on said board, said device comprising:

a fixture comprising a plurality of rigidly supported upstanding open-ended guides adapted for receiving surface-mounted electronic component dispensing magazines, said guides being positioned in registry with said locations;

a plurality of surface-mounted electronic component dispensing magazines disposed in said guides; and an ejector associated with each of said magazines for ejecting said components from said magazine.

6. The device of claim 5, wherein said guides are rigidly supported in a unitary block of elastomeric material.

7. The device of claim 6, wherein said ejectors simultaneously eject one of said components from each of said magazines.

8. The device of claim 7, comprising:

first resilient means in each magazine for retaining a stack of components in said magazine; and powering means associated with each of said ejectors for exerting force against said components and thereby overcoming the retaining force of said first resilient means.

9. The device of claim 8, comprising second resilient means associcated with each of said ejectors, effectively interposed between said powering means and said components, for compensating for varying component heights.

10. The device of claim 9, wherein each of said ejectors includes:

a shaft adapted for axial movement in said magazine, the end of said shaft being in abutment with said stack of components;

a framework mounted to said fixture;

first shaft-engaging means mounted to said framework and releasably engaging said shaft;

second shaft-engaging means mounted to said magazine and releasably engaging said shaft alternately with said first shaft-engaging means; and third resilient means effectively interposed between said first and second shaft-engaging means and urging said shaft-engaging means apart.

11. The device of claim 10, wherein the lower ends of said magazines normally extend downwardly outwardly of the lower ends of said guides.

12. The device of claim 10, wherein said shaft is formed with a plurality of teeth, and said first and second shaft-engaging means include ratchet means adapted to engage said teeth.

13. The device of claim 12, wherein said powering means include means for simultaneously applying upwardly directed force to the lower ends of all of said magazines.

14. The device of claim 13, wherein said powering means include support means supporting said printed circuit board in registery with said fixture.

15. The device of claim 14, wherein said support means include a platen for positioning said printed circuit board below said fixture, and a powered ram for applying said force to said platen, whereby said printed circuit board is brought into and maintained in simultaneous contact with the lower ends of all of said magazines.

16. The device of claim 9, wherein said powering means include a fluid pressure-operated ram.

17. The device of claim 16, wherein said fluid pressure-operated ram is a pneumatic ram.

18. The device of claim 16, wherein said fluid pressure-operated ram is a hydraulic ram.

19. The device of claim 10, wherein said powering means include an electromagnetically operated ram.

20. A printed circuit board assembling apparatus, comprising:

a device for dispensing a plurality of surface-mounted electronic components at predetermined locations on said board, said device comprising:

a fixture comprising a plurality of rigidly supported upstanding open-ended guides adapted for receiving surface-mounted electronic component dispensing magazines, said guides being positioned in registry with said locations;

a plurality of surface-mounted electronic component dispensing magazines disposed in said guides; and an ejector associated with each of said magazines for ejecting said components from said magazine.

21. The apparatus of claim 20, wherein said guides are rigidly supported in a unitary block of elastomeric material.

22. The apparatus of claim 21, wherein said ejectors simultaneously eject one of said components from each of said magazines.

23. The apparatus of claim 22, further comprising:

first resilient means in each magazine for retaining a stack of components in said magazine; and powering means associated with each said ejector for exerting force against said components and thereby overcoming the retaining force of said first resilient means.

24. The apparatus of claim 23, further comprising:

second resilient means assocaited with said ejector, effectively interposed between said powering means and said components, for compensating for varying component heights.

25. The apparatus of claim 24, wherein said ejector includes:

a shaft adapted for axial movement in said magazine, the end of said shaft being in abutment with said stack of components;

a framework mounted to said fixture;

first shaft-engaging means mounted to said framework and releasably engaging said shaft;

second shaft-engaging means mounted to said magazine and releasably engaging said shaft alternately with said first shaft-engaging means; and third resilient means effectively interposed between said first and second shaft-engaging means and urging said shaft-engaging means apart.

26. The apparatus of claim 25, wherein the lower ends of said magazines normally extend downwardly outwardly of the lower ends of said guides.

27. The apparatus of claim 25, wherein said shaft is formed with a plurality of teeth, and said first and second shaft-engaging means include ratchet means adapted to engage said teeth.

28. The apparatus of claim 27, wherein said powering means include means for simultaneously applying upwardly directed force to the lower ends of all of said magazines.

29. The apparatus of claim 28, wherein said powering means include support means supporting said printed circuit board in registery with said fixture.

30. The apparatus of claim 29, wherein said support means include a platen for positioning said printed circuit board below said fixture, and a powered ram for applying said force to said platen, whereby said printed circuit board is brought into and maintained in simultaneous contact with the lower ends of all of said magazines.

31. The apparatus of claim 25, wherein said powering means include a fluid pressure-operated ram.

32. The apparatus of claim 31, wherein said fluid pressure-operated ram is a pneumatic ram.

33. The apparatus of claim 31, wherein said fluid pressure-operated ram is a hydraulic ram.

34. The apparatus of claim 26, wherein said powering means include an electromagnetically operated ram.

35. A method for producing a fixture for positioning a plurality of surface-mounted electronic component dispensing magazines in a printed circuit board assembling apparatus, said method comprising:

fabricating a prototype printed circuit board;

temporarily supportingly affixing the lower end of an upstanding guide to said board in registry with the footprint of each surface-mounted electronic component comprising the assembled circuit;

forming a dam around the periphery of the prototype board;

covering the area within the dam surrounding the guides with a layer of liquid elastomeric material;

allowing or causing said material to harden into a rigid block; and separating said prototype board from said block, thereby exposing the open lower ends of said guides.

* * * * *